United States Patent
Seo et al.

(10) Patent No.: US 10,741,141 B2
(45) Date of Patent: Aug. 11, 2020

(54) VOLTAGE REFERENCE AND CURRENT SOURCE MIXING METHOD FOR VIDEO DAC

(71) Applicant: Kopin Corporation, Westborough, MA (US)

(72) Inventors: Yong Seok Seo, Palo Alto, CA (US); Jin Kuk Kim, San Jose, CA (US); Seung Youb Kim, Fremont, CA (US)

(73) Assignee: Kopin Corporation, Westborough, MA (US)

( * ) Notice: Subject to any disclaimer, the term of this patent is extended or adjusted under 35 U.S.C. 154(b) by 0 days.

(21) Appl. No.: 14/615,958

(22) Filed: Feb. 6, 2015

(65) Prior Publication Data

US 2015/0221277 A1 Aug. 6, 2015

Related U.S. Application Data

(60) Provisional application No. 62/049,612, filed on Sep. 12, 2014, provisional application No. 61/936,553, filed on Feb. 6, 2014.

(51) Int. Cl.
*G09G 3/36* (2006.01)
*H03M 1/66* (2006.01)
*G09G 3/20* (2006.01)

(52) U.S. Cl.
CPC ......... *G09G 3/3696* (2013.01); *G09G 3/2092* (2013.01); *G09G 3/3607* (2013.01);
(Continued)

(58) Field of Classification Search
None
See application file for complete search history.

(56) References Cited

U.S. PATENT DOCUMENTS 5,410,311 A * 4/1995 Doyle ................. H03M 1/0604
323/313
6,384,806 B1 5/2002 Matsueda
(Continued)

FOREIGN PATENT DOCUMENTS

CN 1239276 A 12/1999
CN 1090121 A 1/2007
(Continued)

OTHER PUBLICATIONS

Invitation to Pay Additional Fees for PCT/US2015/014761 dated May 13, 2015 entitled "Voltage Reference and Current Source Mixing Method for Video DAC".
(Continued)

*Primary Examiner* — David D Davis
(74) *Attorney, Agent, or Firm* — Hamilton, Brook, Smith & Reynolds, P.C.

(57) ABSTRACT

A method of arranging components in an integrated circuit includes providing two or more circuit cells of a first type and providing two or more circuit cells of a second type. The circuit cells of the first type are configured to operate in conjunction with the circuit cells of the second type. The method further includes arranging the circuit cells of the first and second types in an alternating pattern such that each circuit cell of the first type is adjacent to at least one circuit cell of the second type. The alternating pattern may be an array of rows and columns and may include a repeating pattern of one first type cell and one second type cell in each of the columns. The alternating pattern may include a repeating pattern of one cell of the first type and two cells of the second type in each of the columns.

11 Claims, 9 Drawing Sheets

(52) U.S. Cl.
CPC ...... *H03M 1/66* (2013.01); *G09G 2300/0426* (2013.01); *G09G 2310/027* (2013.01); *G09G 2310/0291* (2013.01)

(56) References Cited

U.S. PATENT DOCUMENTS

| | | | |
|---|---|---|---|
| 6,750,839 B1 | 6/2004 | Doyle | |
| 2003/0142084 A1* | 7/2003 | Chang | G09G 3/20 345/204 |
| 2003/0218618 A1 | 11/2003 | Phan | |
| 2007/0080838 A1* | 4/2007 | Asayama | H03M 1/0863 341/144 |
| 2007/0133328 A1* | 6/2007 | Koide | G11C 11/22 365/210.1 |
| 2007/0194962 A1* | 8/2007 | Asayama | H03M 1/1014 341/144 |
| 2008/0218615 A1* | 9/2008 | Huang | H04N 5/2176 348/294 |
| 2009/0128552 A1* | 5/2009 | Fujiki | G06T 15/06 345/419 |
| 2011/0080533 A1* | 4/2011 | Champion | H04N 9/3129 348/744 |
| 2011/0175863 A1* | 7/2011 | Shin | G09G 3/20 345/204 |
| 2012/0314902 A1* | 12/2012 | Kimura | G06F 3/017 382/103 |
| 2013/0057598 A1* | 3/2013 | Iwamoto | G02F 1/136286 345/690 |
| 2013/0265218 A1* | 10/2013 | Moscarillo | G06F 3/017 345/156 |
| 2014/0146914 A1* | 5/2014 | Kuttner | H03M 1/66 375/295 |
| 2014/0327611 A1* | 11/2014 | Ono | G06F 3/0425 345/156 |

FOREIGN PATENT DOCUMENTS

| | | |
|---|---|---|
| CN | 102067026 A | 5/2011 |
| CN | 105981091 A | 9/2016 |
| DE | 197 46 329 | 3/1999 |
| JP | 2003045984 A | 2/2003 |
| JP | 2006189711 A | 7/2006 |
| JP | 2008248927 A | 10/2008 |
| JP | 2013125596 A | 6/2013 |
| JP | 6573622 | 8/2019 |
| WO | WO 2005/057532 | 6/2005 |
| WO | WO 2015/120236 | 8/2015 |

OTHER PUBLICATIONS

International Search Report and Written Opinion for PCT/US2015/014761 dated Jul. 14, 2015 entitled "Voltage Reference and Current Source Mixing Method for Video DAC".

International Preliminary Report on Patentability for PCT/US2015/014761 dated Aug. 18, 2016 entitled " Voltage Reference and Current Source Mixing Method for Video DAC".

* cited by examiner

VOLTAGE REFERENCE AND CURRENT SOURCE MIXING METHOD FOR VIDEO DAC

RELATED APPLICATION(S)

This application claims the benefit of U.S. Provisional Application No. 62/049,612, filed on Sep. 12, 2014, and U.S. Provisional Application No. 61/936,553, filed on Feb. 6, 2014. The entire teachings of the above applications are incorporated herein by reference.

BACKGROUND OF THE INVENTION

Mobile computing devices, such as notebook PCs, smart phones, and tablet computing devices, are now common tools used for producing, analyzing, communicating, and consuming data in both business and personal life. Consumers continue to embrace a mobile digital lifestyle as the ease of access to digital information increases with high-speed wireless communications technologies becoming ubiquitous. Popular uses of mobile computing devices include displaying large amounts of high-resolution computer graphics information and video content, often wirelessly streamed to the device.

While these devices typically include a display screen, the preferred visual experience of a high-resolution, large format display cannot be easily replicated in such mobile devices because the physical size of such device is limited to promote mobility. Another drawback of the aforementioned device types is that the user interface is hands-dependent, typically requiring a user to enter data or make selections using a keyboard (physical or virtual) or touch-screen display.

As a result, consumers are now seeking a hands-free high-quality, portable, color display solution to augment or replace their hands-dependent mobile devices.

Integrated circuits used in such color display solutions may be vulnerable to unavoidable process variations that occur when the integrated circuits are fabricated. The process variations may occur across several batches of fabrication or across the same batch, and may result in performance degradation of the integrated circuit.

SUMMARY OF THE INVENTION

Recently developed micro-displays can provide large-format, high resolution color pictures and streaming video in a very small form factor. One application for such displays can be integrated into a wireless headset computer worn on the head of the user with a display within the field of view of the user, similar in format to eyeglasses, audio headset or video eyewear. A "wireless computing headset" device includes one or more small high-resolution micro-displays and optics to magnify the image. The WVGA micro-displays can provide super video graphics array (SVGA) (800×600) resolution or extended graphic arrays (XGA) (1024×768) or even higher resolutions. A wireless computing headset contains one or more wireless computing and communication interfaces, enabling data and streaming video capability, and provides greater convenience and mobility through hands dependent devices. For more information concerning such devices, see co-pending patent applications entitled "Mobile Wireless Display Software Platform for Controlling Other Systems and Devices," U.S. application Ser. No. 12/348,648 filed Jan. 5, 2009, "Handheld Wireless Display Devices Having High Resolution Display Suitable For Use as a Mobile Internet Device," PCT International Application No. PCT/US09/38601 filed Mar. 27, 2009, and "Headset Computer (HSC) As Auxiliary Display With ASR and HT Input," U.S. application Ser. No. 13/799,570 filed Mar. 13, 2013, each of which are incorporated herein by reference in their entirety.

The terms, "HSC" headset computers, "HMD" head mounted display device, and "wireless computing headset" may be used interchangeably herein.

A micro-display used in conjunction with a HSC requires highly-integrated circuitry in support of the pixel array that actually produces an image. The support circuitry often implements functionality that is highly sensitive to variations in circuit topologies and layout geometries. Slight process variations that occur during fabrication of integrated circuits can be enough to exploit these sensitive functionalities. A process variation that occurs uniformly across certain components may help to reduce the sensitivity to the variations. The embodiments described herein address techniques for reducing sensitivity to process variations.

Methods embodying the present invention arrange components in an integrated circuit by providing two or more circuit cells of a first type and providing two or more circuit cells of a second type. The circuit cells of the first type are configured to operate in conjunction with the circuit cells of the second type. The method further includes arranging the circuit cells of the first and second types in an alternating pattern such that each circuit cell of the first type is adjacent to at least one circuit cell of the second type. The alternating pattern may be an array of rows and columns and may include a repeating pattern of one first type cell and one second type cell in each of the columns.

In other embodiments, the alternating pattern may include a repeating pattern of one cell of the first type and two cells of the second type in each of the columns.

In one aspect, the invention may be a method of arranging components in an integrated circuit, including providing two or more circuit cells of a first type, and providing two or more circuit cells of a second type. The circuit cells of the first type are configured to operate in conjunction with the circuit cells of the second type. The method may further include arranging the circuit cells of the first type and the circuit cells of the second type in an alternating pattern such that each circuit cell of the first type is adjacent to at least one circuit cell of the second type.

In one embodiment, the alternating pattern is an array of rows and columns. In another embodiment, the alternating pattern includes a repeating pattern of one cell of the first type and one cell of the second type in each of the columns. In another embodiment, the alternating pattern includes a repeating pattern of one cell of the first type and two cells of the second type in each of the columns.

In one embodiment, the circuit cells of the first type provide a reference to the circuit cells of the second type. In one embodiment, the reference is a voltage reference. In another embodiment, the reference is a current reference.

In one embodiment, the circuit cells of the first type include a reference cell and the circuit cells of the second type include a video DAC cell.

In another aspect, the invention may be an integrated circuit, comprising two or more circuit cells of a first type, and two or more circuit cells of a second type. The circuit cells of the first type are configured to operate in conjunction with the circuit cells of the second type, e.g., the circuit cells of the first and second type may operate together to accomplish a certain function. The circuit cells of the first type and the circuit cells of the second type are arranged in an alternating pattern such that each circuit cell of the first type is adjacent to at least one circuit cell of the second type.

In one embodiment, the alternating pattern is an array of rows and columns. In another embodiment, the alternating pattern includes a repeating pattern of one cell of the first type and one cell of the second type in each of the columns.

In another embodiment, the alternating pattern includes a repeating pattern of one cell of the first type and two cells of the second type in each of the columns. In one embodiment, the circuit cells of the first type provide a reference voltage to the circuit cells of the second type. In one embodiment, the circuit cells of the first type include a reference cell and the circuit cells of the second type include a video DAC cell.

In another aspect, the invention may be method of arranging components in an integrated circuit, comprising providing a digital to analog converter (DAC) configured to generate a ramped voltage output, and providing two amplifiers, each of which receives the ramped voltage output. The method further includes arranging the two amplifiers to each drive one or more columns of a pixel array.

One embodiment further includes arranging the two amplifiers to drive the columns of the pixel array from two sides of the pixel array. In one embodiment, the amplifiers further drive a common terminator element.

In another aspect, the invention may be an integrated circuit, comprising a digital to analog converter (DAC) configured to generate a ramped voltage output, a first amplifier configured to receive the ramped voltage output, and a second amplifier configured to receive the ramped voltage output. The first and second amplifiers are arranged to each drive one or more columns of a pixel column of a video display.

In one embodiment, the first and second amplifiers are configured to drive the columns of the pixel array from two sides of the pixel array. In another embodiment, the first and second amplifiers are configured to drive a terminator element.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
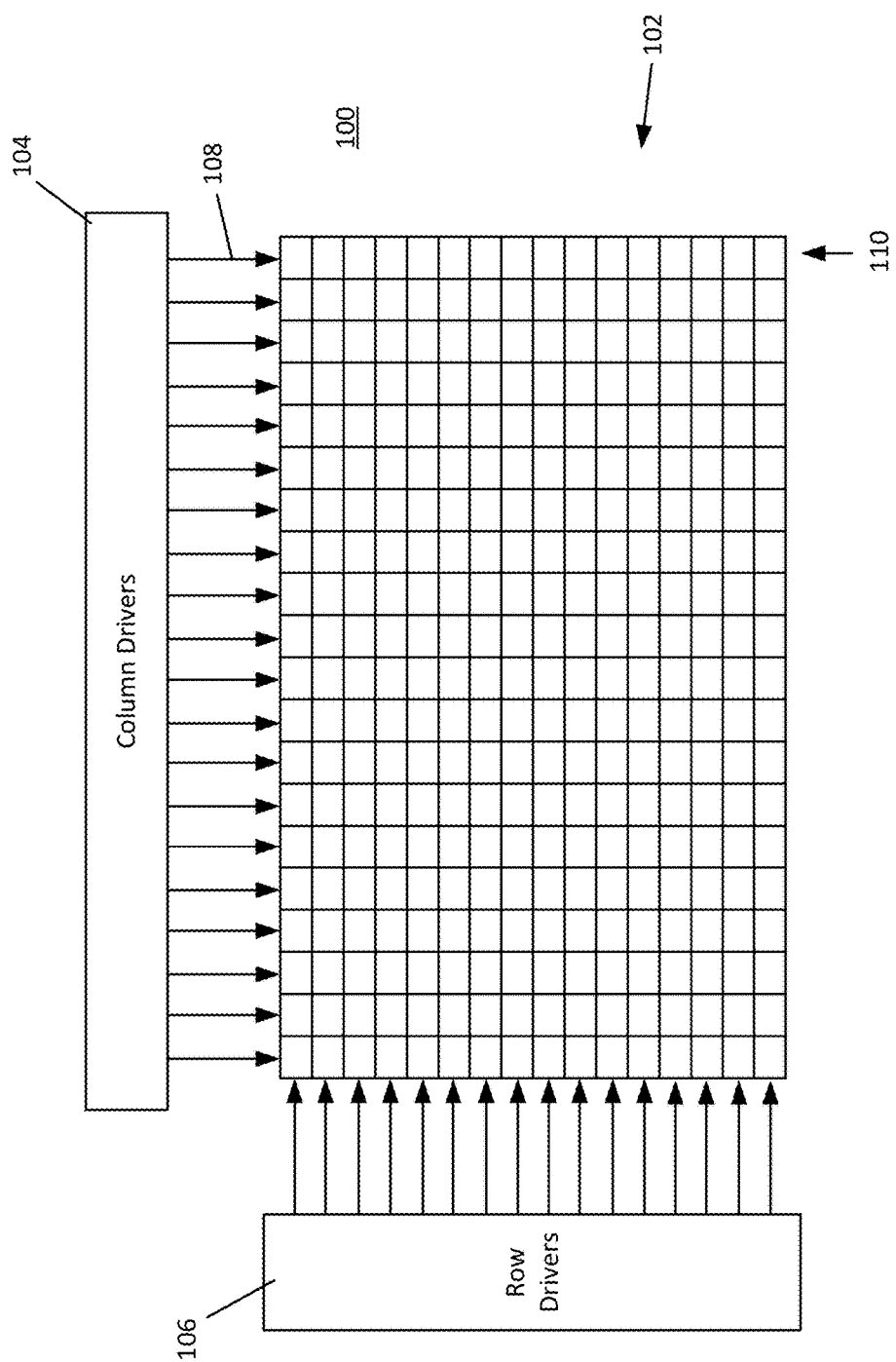
FIG. 1 illustrates a simple example of a micro-display according to the embodiments.

The micro-displays described herein generally include a pixel array 102 driven by a number of data and control signals, as shown in the simple example of FIG. 1. This exemplary micro-display 100 includes 20 columns and 16 rows for a total of 320 pixels, although as described above, actual micro-displays typically have many more pixels (e.g., XGA with 1024 columns and 768 rows).

The micro-display includes column drivers 104 and row drivers 106 that together provide information to the pixel array 102. The column drivers 104 generally provide image information to the pixels, and the row drivers 106 provide control information to the pixels. A column driver signal 108 for a particular a particular pixel column 110 may include multiple signals.

Figure 2:
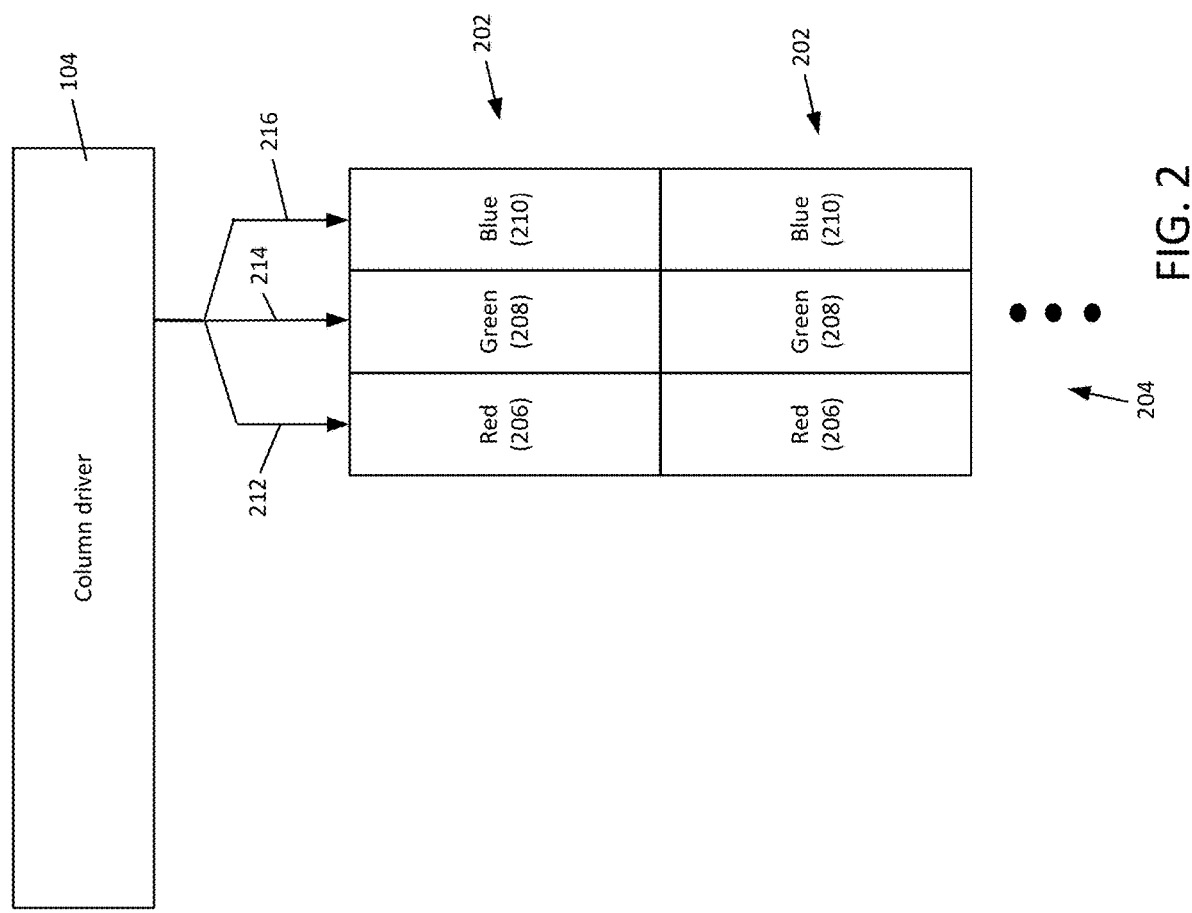
FIG. 2 illustrates an expanded view of the column driver of shown in FIG. 1.

FIG. 2 shows an expanded view of a column driver 104 for a Red-Green-Blue (RGB) pixel array. FIG. 2 shows the first two pixels 202 for a single column 204 of the array. Each pixel 202 includes a red component 206, a green component 208 and a blue component 210. For each column, the column driver 204 drives three information signals; a red signal 212, a green signal 214 and a blue signal 216. These information signals extend to all of the pixels in the column 204.

Figure 3:
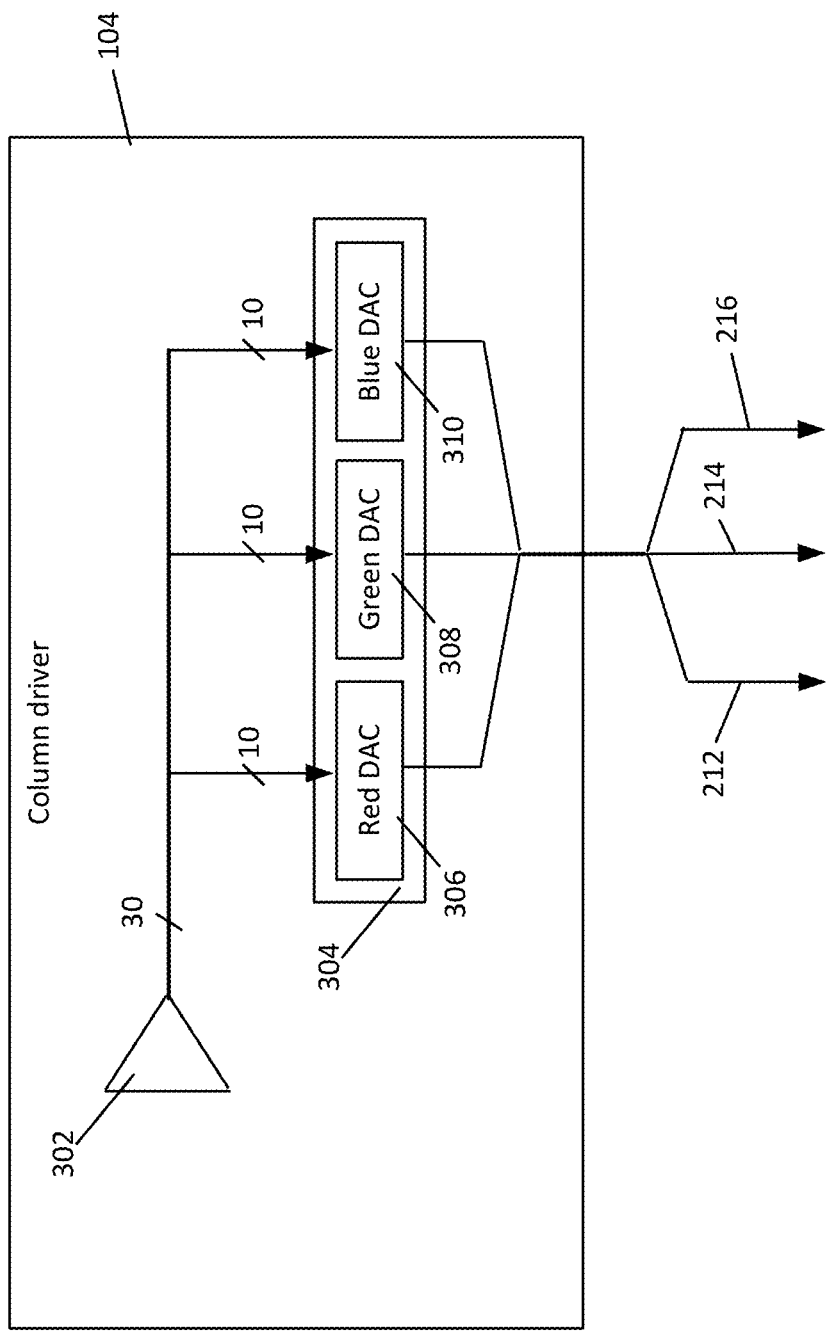
FIG. 3 shows an example of a digital to analog converter in the column driver of FIG. 1.

The information signals that drive the pixels are generally analog signals, generated from digital signals by way of a digital to analog converter (DAC). FIG. 3 shows an example of such a conversion for one pixel column. A digital buffer 302 drives 30 bits of information (10 bits of red information, 10 bits of green information and 10 bits of blue information) and provides the 30 bits to a three channel DAC 304. Each channel within the three channel DAC 304 converts 10 bits of information to an analog signal; in other words, the three channel DAC 304 includes a 10 bit red DAC 306, a 10 bit green DAC 308 and a 10 bit blue DAC 310.

Figure 4:
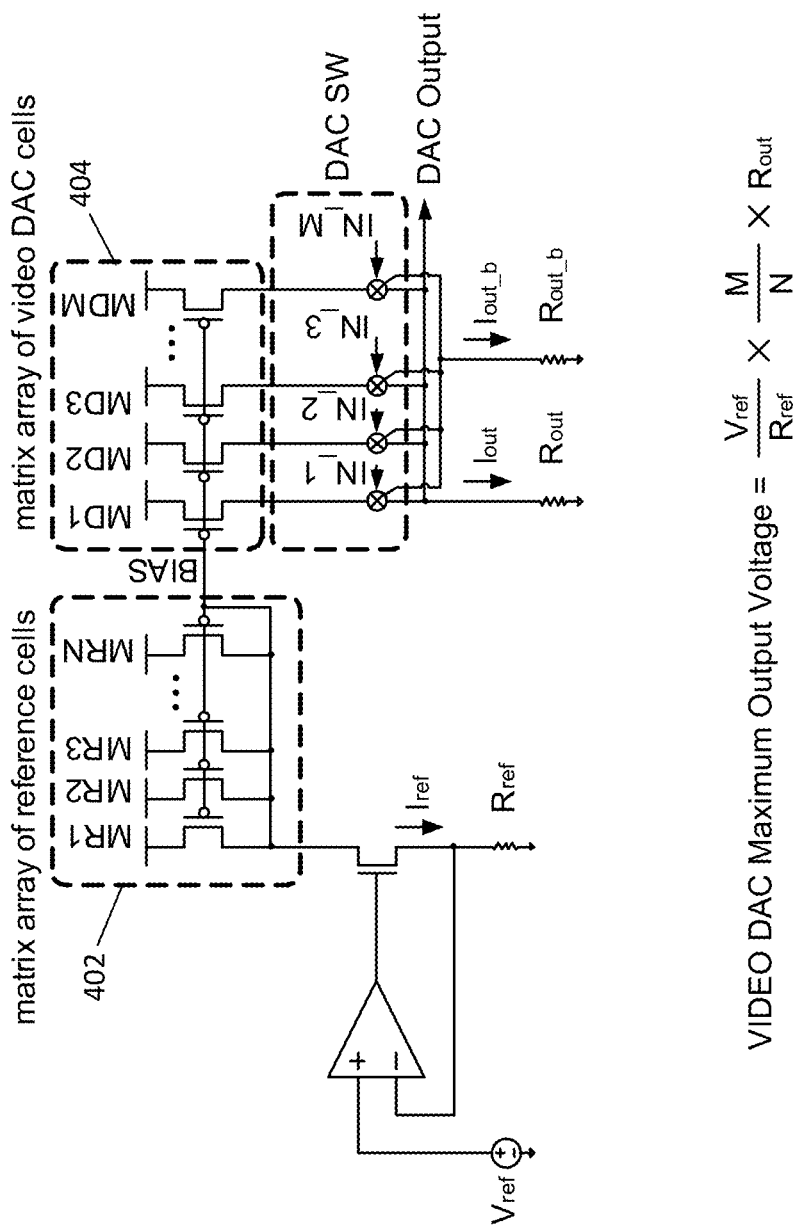
FIG. 4 shows an example of a DAC architecture that uses a matrix array of reference cells and a matrix array of video DAC cells.

A video DAC, such as DAC 304 in FIG. 3, may include a matrix array of reference cells and a matrix array of video DAC cells. FIG. 4 shows an example of a DAC architecture that uses a matrix array of reference cells 402 and a matrix array of video DAC cells 404. The reference cells 402 generally provide a reference standard to the video DAC cells 404, such as, for example, a reference voltage or a reference current. Carefully laying out the reference cell array and the video DAC cell array may help to minimize the effect of fabrication process variations.

Figure 5:
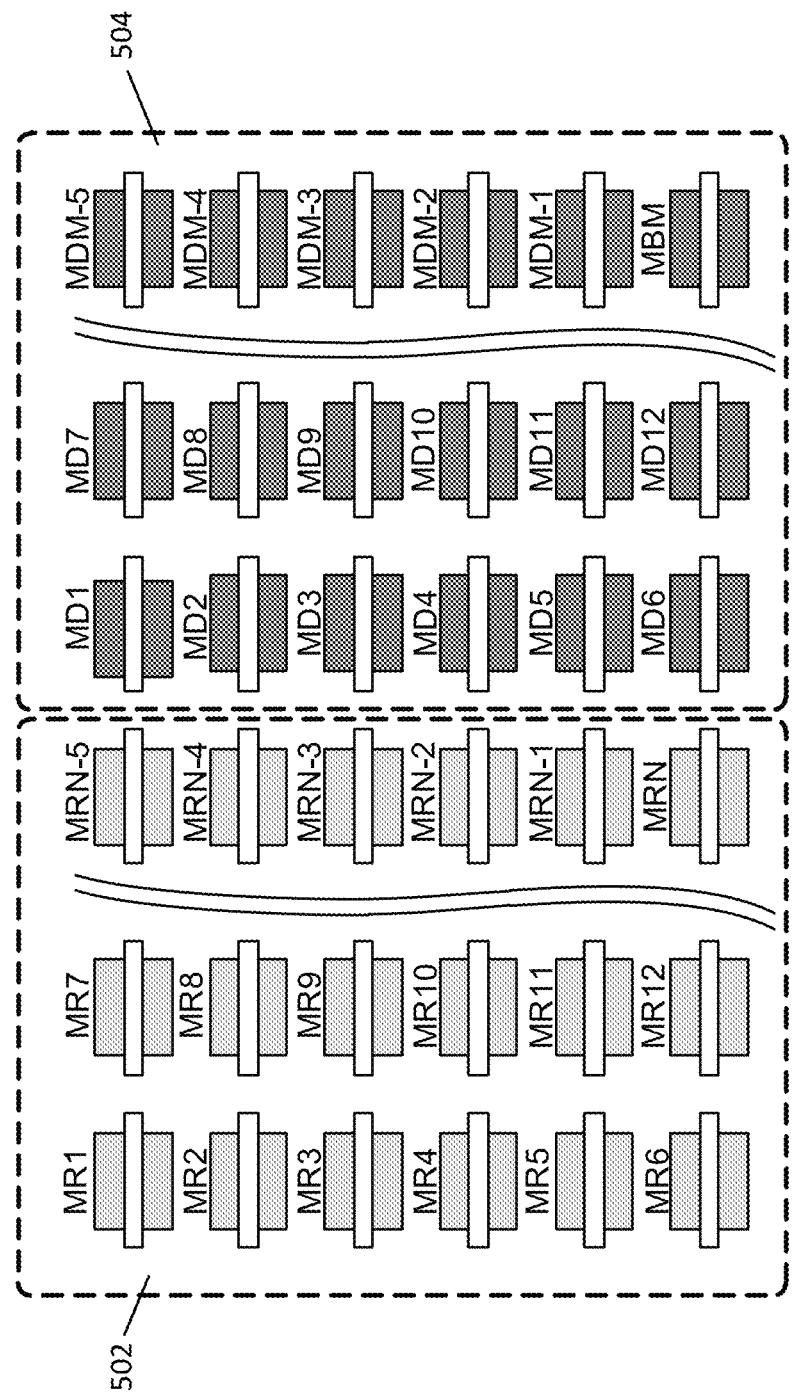
FIG. 5 shows an example of one way of laying out the reference cell array and the video DAC cell array.

FIG. 5 illustrates an example of one way of laying out the reference cell array and the video DAC cell array. In this example, the reference cells 502 are arranged in a first block and the video DAC cells 504 are arranged in a second block. The second block is physically separated from the first block. With the arrangement shown in FIG. 5, a process variation that affects the reference cells 502 may be localized such that it affects the reference cells 502 but not the video DAC cells 504. Such a discrepancy between physical characteristics of the reference cells and the video DAC cells may degrade the performance of the associated DAC.

Figure 6:
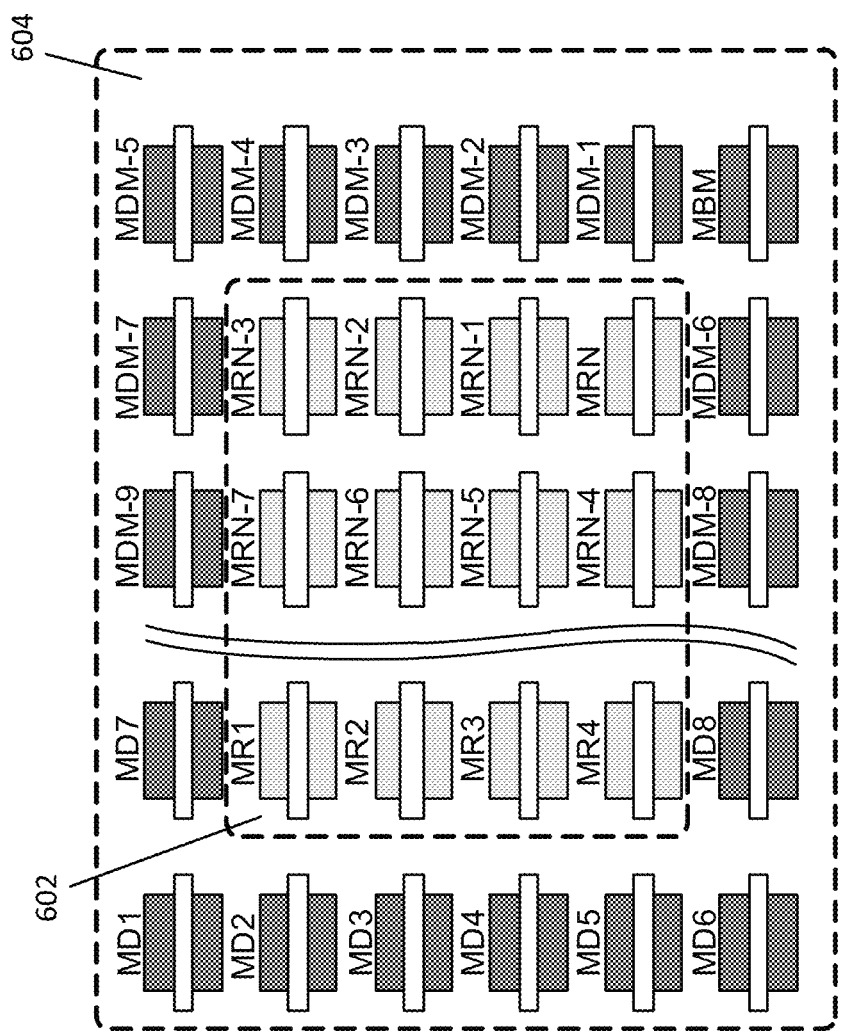
FIG. 6 illustrates an example of another way of laying out the reference cell array and the video DAC cell array.

FIG. 6 shows an example of another way of laying out the reference cell array and the video DAC array. In this example, the reference cells 602 are arranged in a block, surrounded by a ring of video DAC cells 604. With this arrangement, many of the reference cells 602 are adjacent to video DAC cells 604. Process variations will generally affect components in close proximity to one another similarly, such that the effects of the process variation may be reduced as compared to an arrangement where the cells are more widely distributed. Some of the reference cells, however, are not adjacent to video DAC cells, so a potential for process variation degradation may still exist.

Figure 7:
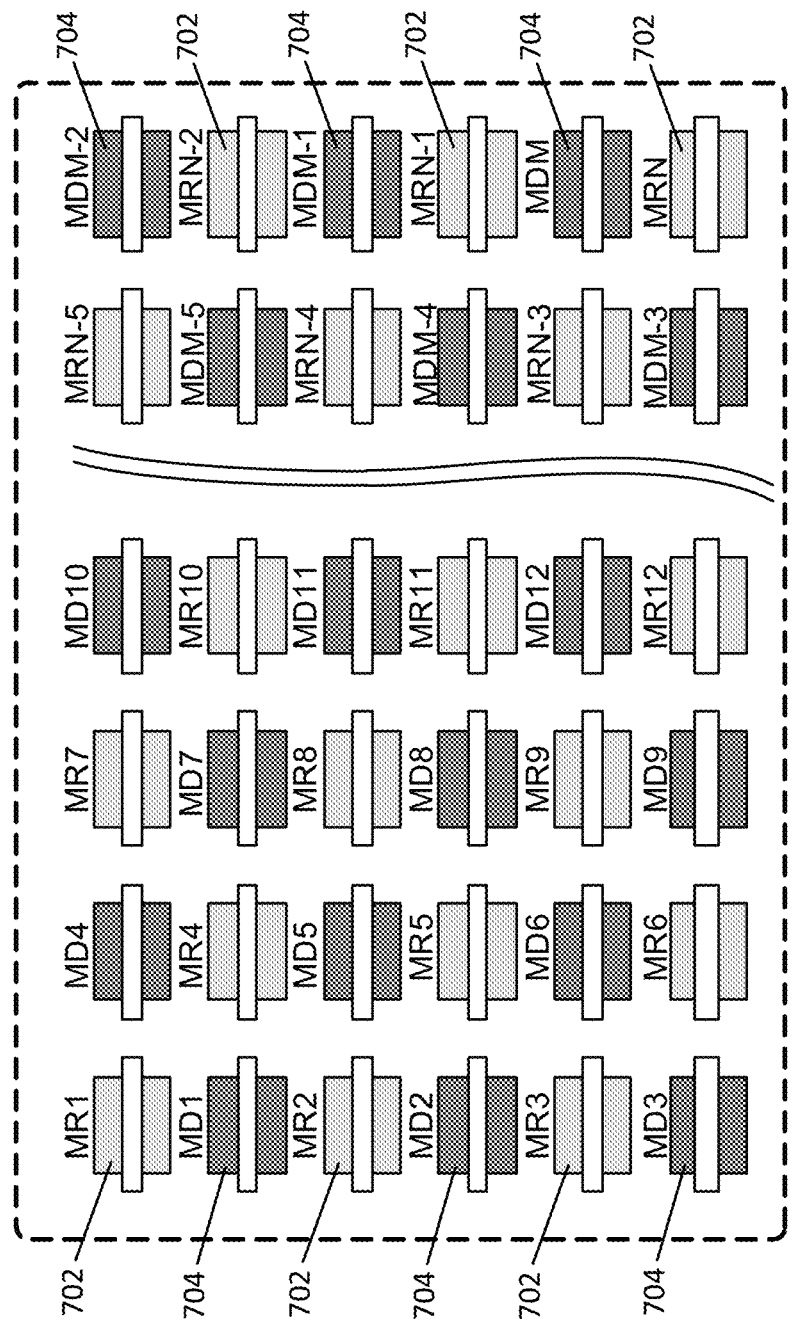
FIG. 7 illustrates an example of an arrangement of reference and video DAC cells according to the described embodiments.

FIG. 7 shows an example of an arrangement of reference and video DAC cells according to one of the described embodiments. In this example, the reference cells 702 and the video DAC cells 704 are mixed one-by-one, in what amounts to a "checkerboard" pattern. The same visual convention that is used in FIGS. 4-6 to distinguish reference cells from video DAC cells is also used in FIG. 7 and FIG. 8 (i.e., the reference cells are lightly shaded and the video DAC cells are more darkly shaded. For clarity, not all of the cells are labeled with reference numbers.

The arrangement of the example embodiment in FIG. 7 places each reference cell 702 adjacent to at least one video DAC cell 704. As described elsewhere herein, process variations will generally affect components in close proximity to one another similarly, such that the effects of the process variation may be reduced as compared to an arrangement where the cells are more widely distributed.

Figure 8:
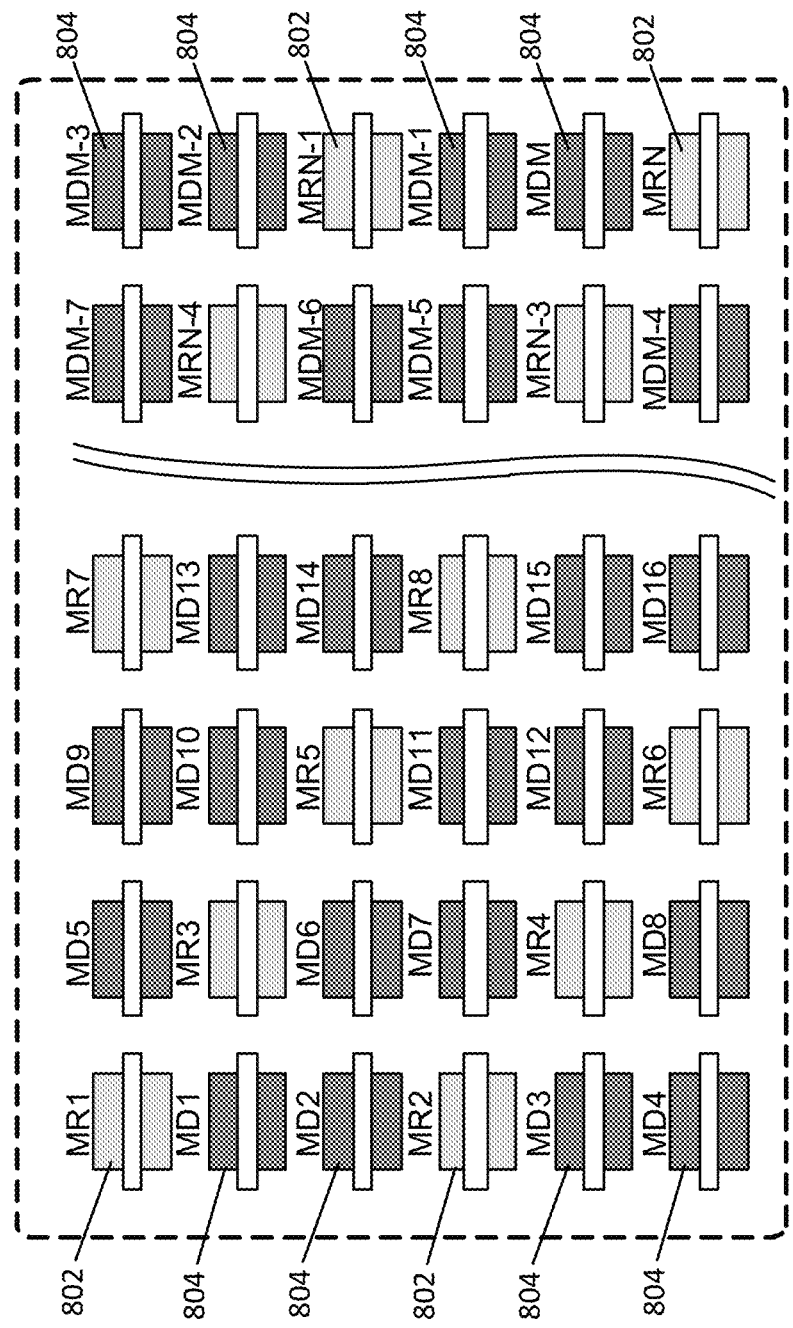
FIG. 8 illustrates another example of an arrangement of reference and video DAC cells according to the described embodiments.

FIG. 8 shows another example of an arrangement according to the described embodiments. In this example, the reference cells 802 are mixed "one-by-two," which again places each reference cell 802 adjacent to at least one video DAC cell 804. This exemplary embodiment, while similar to the arrangement shown in FIG. 7, provides a different distribution of the video DAC cells with respect to the reference cells. This distribution may provide improved response to certain types of process variations.

The embodiments exemplified by those shown in FIGS. 7 and 8 may, for certain process variations, mitigate degradations with respect to the arrangement shown in FIG. 6. Further, the arrangement shown in FIG. 6 may be limited to certain layout topologies. For example, the ring of video DAC cells 604 may be limited to a square configuration for better performance as compared to rectangular or other shapes. The arrangements of the embodiments shown in FIGS. 7 and 8 may permit many aspect ratios while still delivering acceptable performance. This flexibility facilitates better and easier layout design and circuit integration.

The arrangements of FIGS. 7 and 8 are examples, and are not intended to be limiting. Other arrangements that place reference cells and DAC cells in close proximity are also within the scope of embodiments of the invention.

In some embodiments, such as for a LCoS (Liquid Crystal on Silicon) display device, the column drivers shown in FIG. 1 may include a ramp DAC and amplifier, which together produce a voltage ramp. The voltage ramp can be sampled and held at a particular time to produce a desired fixed voltage output for use by the associated column of pixels. Varying the sample time varies the fixed voltage output.

Due to requirement for precise control of the column voltage provided to the column of pixels, the ramp DAC generally needs to be a high performance device. An embedded ramp DAC may not provide such precise control. Consequently, an LCoS display system may utilize a ramp DAC that is external to the LCoS device. An external ramp DAC is not limited by the size and power constraints of the LCoS architecture, which may result in better performance. The external loading required for this arrangement, however, may increase the power consumption of the LCoS device.

An example of an external ramp DAC may include a DAC, driving a low pass filter, with the output of the low pass filter feeding an amplifier. The amplifier drives an external port of the LCoS device. This arrangement provides increased performance at the cost of increased power consumption.

Figure 9:
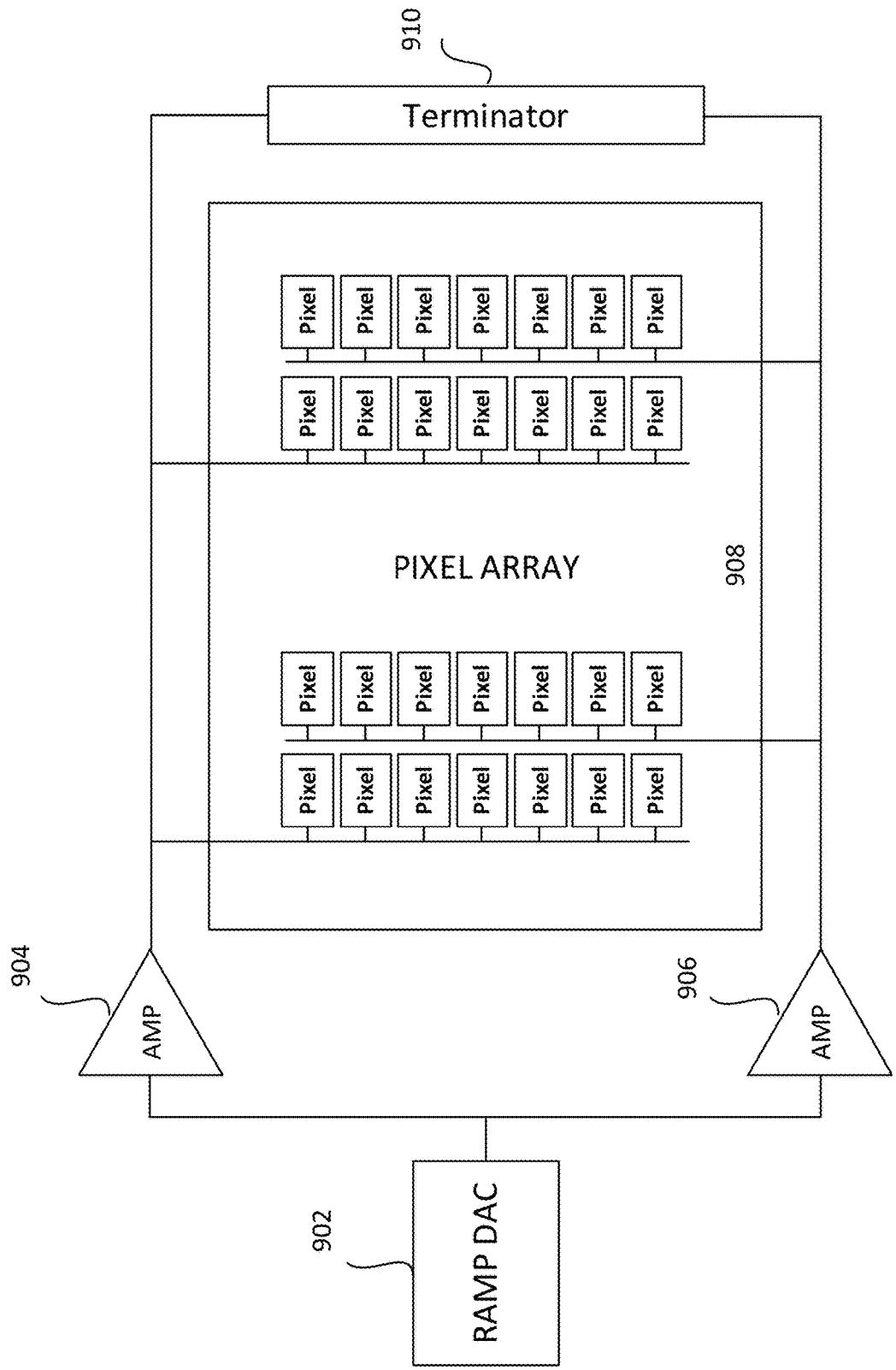
FIG. 9 shows a ramp DAC arrangement integrated with the pixel array according to the described embodiments.

FIG. 9 illustrates an example of a ramp DAC arrangement integrated within an LCoS device, according to an embodiment of the invention. This arrangement includes a single ramp DAC 902, which drives a first amplifier 904 and a second amplifier 906. In this embodiment, the amplifiers 904, 906 are arranged to drive a pixel array 908 from two sides of the array 908. In this example, the two sides are the top and bottom of the array, although other arrangements may also be used. This arrangement provides an improvement in performance as compared to conventional embedded ramp DACs.

The amplifiers also drive a common terminator element 910, which serves to mitigate or eliminate offset of the amplifiers 904, 906. The terminator element 910 may be a real resistance or a complex impedance.

It will be apparent that one or more embodiments, described herein, may be implemented in many different forms of software and hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain embodiments of the invention may be implemented as logic that performs one or more functions. This logic may be hardware-based, software-based, or a combination of hardware-based and software-based. Some or all of the logic may be stored on one or more tangible computer-readable storage media and may include computer-executable instructions that may be executed by a controller or processor. The computer-executable instructions may include instructions that implement one or more embodiments of the invention. The tangible computer-readable storage media may be volatile or non-volatile and may include, for example, flash memories, dynamic memories, removable disks, and non-removable disks.

While this invention has been particularly shown and described with references to example embodiments thereof, it will be understood by those skilled in the art that various changes in form and details may be made therein without departing from the scope of the invention encompassed by the appended claims.

What is claimed is:

1. A method of arranging components in an integrated circuit, comprising:
    disposing two or more digital to analog (DAC) circuit cells on the integrated circuit, each DAC circuit cell configured to convert a digital signal to an analog signal;
    disposing two or more reference circuit cells on the integrated circuit, each reference circuit cell configured to provide a reference signal to at least one of the DAC circuit cells, the two or more DAC circuit cells and the two or more reference circuit cells combining to total a predetermined number of circuit cells of the integrated circuit; and
    arranging the two or more DAC circuit cells and the two or more reference circuit cells in a plurality of rows and columns, each row characterized by a repeating pattern of one reference circuit cell followed by two DAC circuit cells, and the DAC circuit cells and reference circuit cells of each subsequent row shifted by one circuit cell position with respect to its immediately previous row.

2. The method of claim 1, wherein a number of DAC circuit cells and reference circuit cells in each row is an integer multiple of three.

3. The method of claim 1, wherein a number of DAC circuit cells and reference circuit cells in each column is an integer multiple of three.

4. The method of claim 1, wherein each of the two or more reference circuit cells is a voltage reference.

5. The method of claim 1, wherein each of the two or more reference circuit cells is a current reference.

6. An integrated circuit, comprising:
two or more digital to analog (DAC) circuit cells disposed on the integrated circuit, each DAC circuit cell configured to convert a digital signal to an analog signal;
two or more reference circuit cells disposed on the integrated circuit, each reference circuit cell configured to provide a reference signal to at least one of the DAC circuit cells, a combination of the two or more DAC circuit cells and the two or more reference circuit cells total a predetermined number of circuit cells of the integrated circuit; and
the two or more DAC circuit cells and the two or more reference circuit cells being arranged in a plurality of rows and columns, each row characterized by a repeating pattern of one reference circuit cell followed by two DAC circuit cells, and the DAC circuit cells and reference circuit cells of each subsequent row shifted by one circuit cell position with respect to its immediately previous row.

7. The integrated circuit of claim 6, wherein a number of DAC circuit cells and reference circuit cells in each row is an integer multiple of three.

8. The integrated circuit of claim 6, wherein a number of DAC circuit cells and reference circuit cells in each column is an integer multiple of three.

9. The integrated circuit of claim 6, wherein each of the two or more reference circuit cells is a current reference.

10. The integrated circuit of claim 6, wherein each of the two or more reference circuit cells is a current reference.

11. The integrated circuit of claim 6, wherein the reference circuit cells provide a reference standard and the DAC circuit cells include a video DAC cell.

* * * * *